(12) United States Patent
Moore et al.

(10) Patent No.: US 7,817,885 B1
(45) Date of Patent: Oct. 19, 2010

(54) STEPPED LIGHT COLLECTION AND CONCENTRATION SYSTEM, COMPONENTS THEREOF, AND METHODS

(75) Inventors: Duncan T. Moore, Fairport, NY (US); Greg R. Schmidt, Gates, NY (US); Blair L. Unger, Rochester, NY (US)

(73) Assignee: University of Rochester, Rochester, NY (US)

( * ) Notice: Subject to any disclaimer, the term of this patent is extended or adjusted under 35 U.S.C. 154(b) by 0 days.

(21) Appl. No.: 12/490,432

(22) Filed: Jun. 24, 2009

Related U.S. Application Data (62) Division of application No. 12/490,417, filed on Jun. 24, 2009.

(51) Int. Cl.
*G02B 6/26* (2006.01)
*H01L 31/00* (2006.01)
(52) U.S. Cl. .......................................... 385/33; 385/31
(58) Field of Classification Search ......... 385/900–901, 385/146, 134, 100, 36, 31
See application file for complete search history.

(56) References Cited

U.S. PATENT DOCUMENTS

| | | | |
|---|---|---|---|
| 4,307,936 A | 12/1981 | Ochiai | |
| 4,389,085 A | 6/1983 | Mori | |
| 4,411,490 A | 10/1983 | Daniel | |
| 4,505,264 A | 3/1985 | Tremblay | |
| 5,877,874 A | 3/1999 | Rosenberg | |
| 6,005,692 A | 12/1999 | Stahl | |

(Continued)

FOREIGN PATENT DOCUMENTS

WO   WO2007095049 A2   8/2007

(Continued)

OTHER PUBLICATIONS

Chakmakjian et al.; Lightguide Luminaire with Controlled Numerical Aperture for General Illumination; RPC Photonics, Inc.; www.RPCphotonics.com, 2006.

*Primary Examiner*—Charlie Peng
*Assistant Examiner*—Eric Wong
(74) *Attorney, Agent, or Firm*—William Greener; Bond, Schoeneck & King, PLLC (57) ABSTRACT

A light guide includes a light guide layer having a transversely oriented side-end surface that forms a primary output aperture (exit) for light traveling in a forward propagation direction out of the end surface of the light guide (for, e.g., CPV applications) and, which forms a primary input aperture (entrance) for light traveling in a rearward propagation direction into the end surface of the light guide (for, e.g., illuminator applications), and a first plurality of light injection elements stepped (staggered) in a forward light propagation direction in a first plane along lines parallel to the side-end surface or clocked (tilted) about a y-axis in a z-axis-light propagation direction in a respective first plane, wherein the light injection elements are disposed along parallel lines normal to the side-end surface. The light guide component may further comprise at least a second plurality of light injection elements stepped in at least second plane. A light guide system includes a component light guide, a lenslet array disposed adjacent a top surface of the light guide, and a light-transmitting, TIR medium layer disposed immediately adjacent at least one of the top and bottom surfaces of the light guide.

25 Claims, 12 Drawing Sheets

U.S. PATENT DOCUMENTS

| | | | |
|---|---|---|---|
| 6,021,007 | A | 2/2000 | Murtha |
| 6,957,650 | B2 | 10/2005 | Nyhart, Jr. et al. |
| 7,039,261 | B2 | 5/2006 | Fu et al. |
| 7,101,063 | B2 | 9/2006 | Long et al. |
| 2007/0189701 | A1 | 8/2007 | Chakmakjian et al. |
| 2008/0043466 | A1 | 2/2008 | Chakmakjian et al. |
| 2008/0190413 | A1 * | 8/2008 | Grochola ............... 126/623 |
| 2008/0271776 | A1 | 11/2008 | Morgan |
| 2009/0067784 | A1 * | 3/2009 | Ghosh et al. ............ 385/33 |

FOREIGN PATENT DOCUMENTS

| | | |
|---|---|---|
| WO | WO2008131561 A1 | 11/2008 |

* cited by examiner

STEPPED LIGHT COLLECTION AND CONCENTRATION SYSTEM, COMPONENTS THEREOF, AND METHODS

CROSS-REFERENCE TO RELATED APPLICATIONS

This application is a Divisional application of U.S. Ser. No. 12/490,417 entitled Dimpled Light Collection and Concentration System, Components Thereof and Methods, filed concurrently with the instant application, the disclosure of which is incorporated by reference herein in its entirety.

JOINT RESEARCH AGREEMENT

This application is derived from a pre-existing Joint Research Agreement between the assignee of the instant application, the University of Rochester, and Abengoa Solar New Technologies, S.A.

BACKGROUND OF THE INVENTION

1. Field of the Invention

Embodiments of the invention relate generally to the field of optical light guides and, more particularly, to non-imaging, light guide concentrator and illuminator systems, methods, and applications. Even more particularly, embodiments of the invention relate to a light collection and concentration system used in a concentrated photo-voltaic (CPV) solar energy application, a non-imaging illumination system, and light guide components thereof.

2. Related Art

Solar energy is an important part of the renewable energy solution. Concentrated photovoltaics (CPV) have the potential to provide a source of cost effective and clean energy. By concentrating solar energy with optics, less photovoltaic (PV) material is used, reducing cost, since PVs are expensive and energy-intensive to produce compared with optical components.

Figure 1:
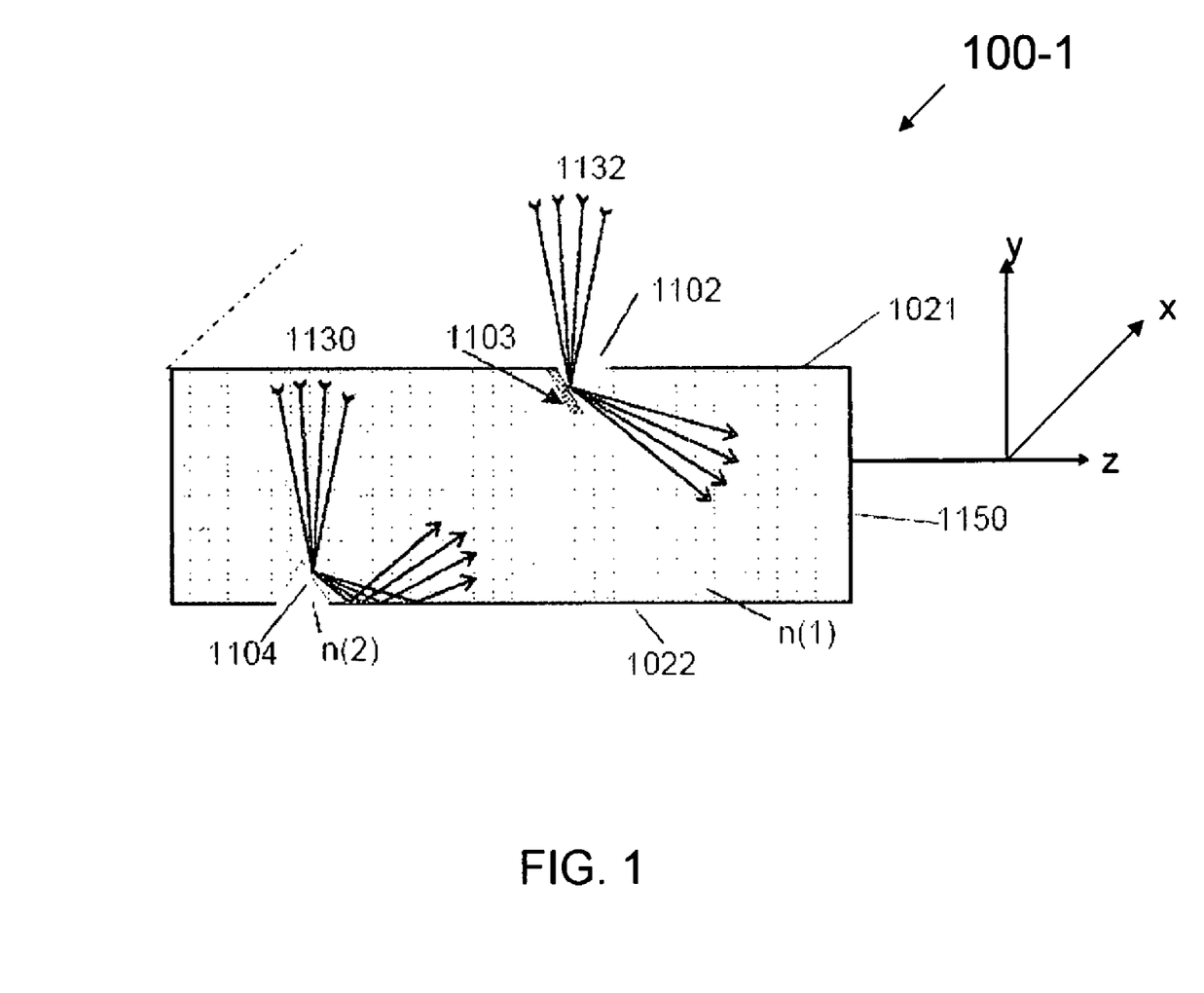
FIG. 1 schematically shows in cross section an illustrative light transport structure with two exemplary light injection elements according to the related art.
Figure 2:
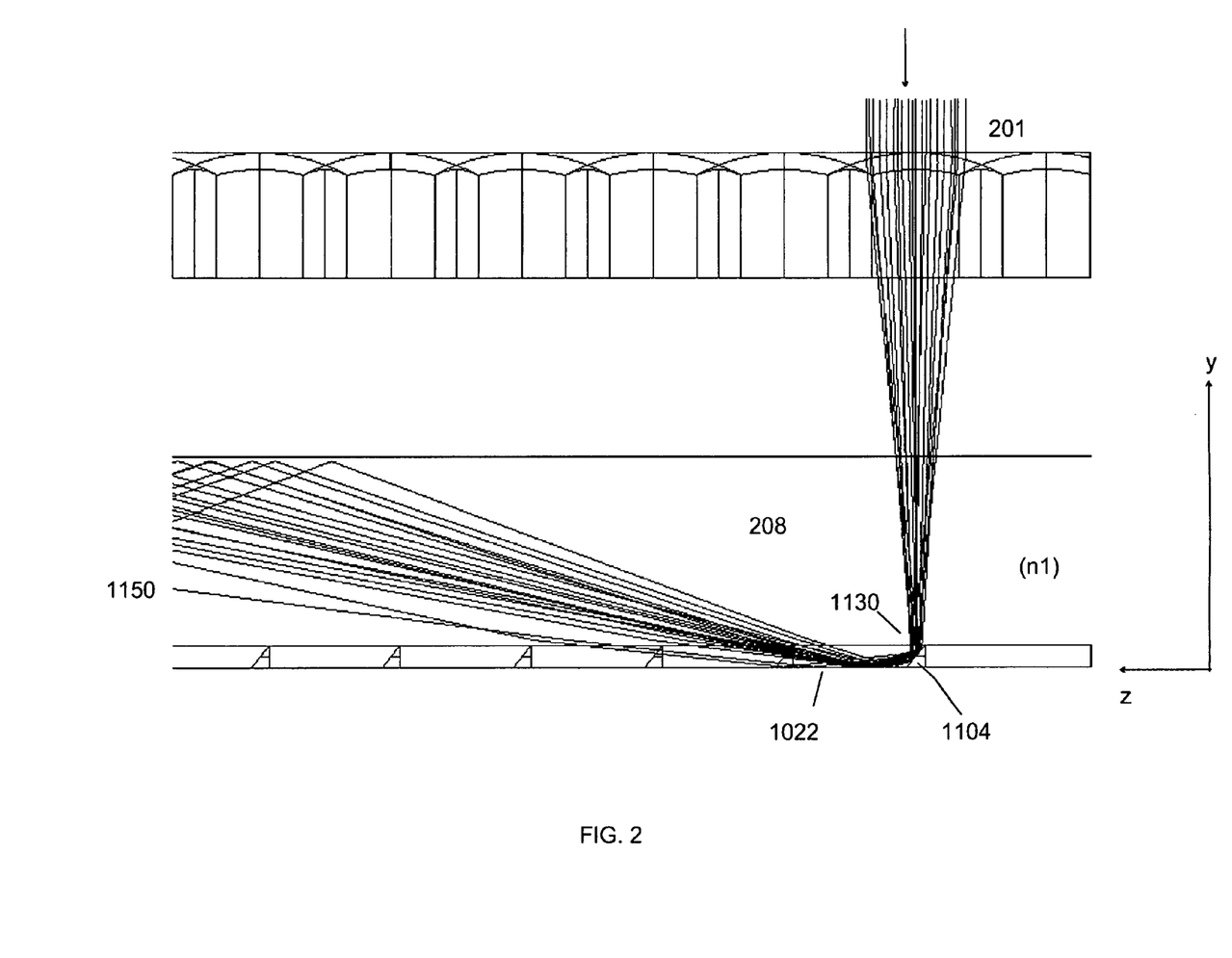
FIG. 2 schematically shows in cross section an illustrative planar light guide solar collection and concentration system incorporating the illustrative light transport structure of FIG. 1, according to the related art.

Co-pending application Ser. No. 12/389,466 entitled LIGHT COLLECTION AND CONCENTRATION SYSTEM, the subject matter of which is incorporated by reference herein in its entirety, discloses a CPV system that incorporates a component light guide apparatus (also referred to as 'light transport structure'). The light guide apparatus includes a plurality of light directing structures (also referred to as 'light injection elements'), 100-1, shown by non-limiting, illustrative example in FIG. 1. In conjunction with FIG. 2, which shows an illustrative, related art planar light guide system, incident light from a distant, extended source (e.g., solar radiation) propagating generally in the (−)y direction is concentrated (e.g., light 1130) by a lens 201 and injected into the light guide 208 via a light injection element, e.g., 1104. The light thereafter propagates generally in the z-direction towards an exit end 1150 of the light guide. The discrete light injection element 1104 is a surface portion of the light guide apparatus made by a partial transverse lateral cut extending from a region of the bottom surface 1022 of the light guide. Depending upon the x-axis tilt angle of the light injection element, the index of refraction of the light guide, and the index of refraction of the external interface of the injection surface, radiation can be totally internally reflected from surface 1104. Alternatively or in addition, a similar light injection element 1102 is a surface of the light guide apparatus made by a partial transverse lateral cut extending from a region of top surface portion 1021. For light injection element 1102, radiation 1132 from a primary concentrator (not shown) optically coupled to light injection element 1102 is intercepted by the light injection element. Shaded area 1103 represents a reflective coating on surface 1102 that reflects the incident light 1132 into the structure for subsequent TIR propagation within the light guide apparatus (in the z-direction) towards and out the exit-end 1150. The exact angular orientations of the light injection elements will depend upon the nature of the reflection process (e.g., reflective (direct or TIR), refractive, diffractive), primary lens f/#, and the light guide index of refraction $n_1$. The notched region behind the light injection element 1104 may, for example, be filled with a lower index dielectric material to facilitate TIR into the light transport structure. Typical dimensions of the light injection elements are 130 µm-140 µm for the tilted reflecting surface, a base dimension of about 130 µm, and a height dimension of about 140 µm. Depending upon the length (z-direction) and width (x-direction) of the light guide structure, there will be many light injection elements (e.g., 1102, 1104, both), which necessarily exist in the transport structure.

The presence of the light injection elements, however, results in a non-ideal light guide since light propagation through the transport structure is hindered by interactions with downstream light injection elements. Light loss can occur by absorption or scattering at a light injection element, out-coupling of light at a light injection element, or étendue dilution from interaction with a light injection element.

In CPV applications, a general object of the system is to collect as much solar radiation as possible and concentrate that radiation as much as possible for input to a PV cell at or near the exit face. Further system objectives include maximizing primary concentrator acceptance angle, maximizing injection concentration, maximizing light guide concentration, and minimizing component and system weights and thicknesses.

In illuminator applications, a general object of the system includes generating a desired output illumination pattern at the top and/or bottom surface of the light guide from a concentrated light input at the side-end thereof.

SUMMARY

An embodiment of the invention is a component light guide. The light guide includes a light guide layer having a top surface and a bottom surface, at least one of which is a substantially planar surface, and a transversely oriented side-end surface that forms a primary output aperture (exit) for light traveling in a forward propagation direction out of the end surface of the light guide (for, e.g., CPV applications) and, which forms a primary input aperture (entrance) for light traveling in a rearward propagation direction into the end surface of the light guide (for, e.g., illuminator applications), characterized by an index of refraction, $n_1$; and a first plurality of light injection elements disposed in at least one of the top and bottom surfaces and extending inwardly therefrom at an angle to the surface, wherein the light injection elements are stepped (staggered) in a forward light propagation direction in a respective first plane along lines parallel to the side-end surface. According to an aspect, the light guide component further comprises at least a second plurality of light injection elements disposed in at least one of the top and bottom surfaces and extending inwardly therefrom at an angle to the surface, wherein the light injection elements are stepped in a light propagation direction in a respective at least second plane along lines parallel to the side-end surface. According to an aspect, the at least second plane is vertically displaced from the first plane. According to an aspect, the light injection elements are air prisms or otherwise reflective; e.g., metal coated, low index material/TIR.

In an alternative aspect, the light injection elements may be clocked about the y-axis so that the injection elements can be disposed in parallel rows along lines normal to the side-end surface.

Another embodiment of the invention is a light guide system that includes a component light guide including a light guide layer having a top surface and a bottom surface, at least one of which is a substantially planar surface, and a transversely oriented side-end surface that forms a primary output aperture for light traveling in a forward propagation direction out of the side-end surface of the light guide and, which, forms a primary input aperture for light traveling in a rearward propagation direction into the side-end surface of the light guide, characterized by an index of refraction, $n_1$; a first plurality of light injection elements disposed in at least one of the top and bottom surfaces and extending inwardly therefrom at an angle to the surface, wherein the light injection elements are stepped (staggered) in a forward light propagation direction in a respective first plane along lines parallel to the side-end surface; a lenslet array defining a lenslet plane, disposed adjacent a top surface of the light guide, wherein each lenslet is in optical registration with a respective light injection element; and, a light-transmitting medium layer characterized by an index of refraction, $n_{med}$, where $n_{med}$ is less than $n_1$, disposed immediately adjacent at least one of the top and bottom surfaces of the light guide. According to an aspect, the system further comprises at least a second plurality of light injection elements disposed in at least one of the top and bottom surfaces and extending inwardly therefrom at an angle to the surface, wherein the at least second plurality of light injection elements are stepped in a light propagation direction in a respective at least second plane along lines parallel to the side-end surface. According to various aspects, the medium layer may or may not be tilted with respect to the lenslet plane, and the light guide may or may not be tilted with respect to the lenslet plane, and the at least second plane may or may not be vertically displaced from the first plane.

In a CPV system application, the aforementioned light guide system provides a means by which concentrated light from the lenslet array is input to and/or directed in a desired propagation direction in the light guide towards the output aperture of the light transport structure. Thus the light injection elements suitably function to capture the primary-concentrated light spot that is for the most part normally incident into the wave guide component and redirect it, illustratively, at 90 degrees, in order for it to propagate along the length (z-direction) of the light guide towards the exit-end thereof.

The light guide layer discussed above is in the form of a thin sheet waveguide; i.e., having a thickness, T, much less than the general length, L, of the structure and thus having a low aspect ratio defined by T/L. Additional light concentration may be provided in the light guide component and system embodiments disclosed herein, for out-coupling through the exit-end of the guide layer and, for example, into a PV cell disposed to directly receive the out-coupled light. According to a non-limiting aspect, secondary concentration may be obtained by convergently curving at least one side-edge (y-z plane) of the light guide component towards the exit end.

Additional features and advantages of the invention will be set forth in the detailed description which follows, and in part will be readily apparent to those skilled in the art from that description or recognized by practicing the invention as described herein, including the detailed description which follows, the claims, as well as the appended drawings.

It is to be understood that both the foregoing general description and the following detailed description are merely exemplary of the invention, and are intended to provide an overview or framework for understanding the nature and character of the invention as it is claimed. The accompanying drawings are included to provide a further understanding of the invention, and are incorporated in and constitute a part of this specification. The drawings illustrate various embodiments of the invention, and together with the description serve to explain the principles and operation of the invention.

BRIEF DESCRIPTION OF THE DRAWINGS

FIG. 7(A) is a perspective, schematic view of a stepped light guide system providing a 9× light concentration according to an illustrative aspect of the invention; FIGS. 7(B-D) are schematic, top plan views, respectively, of a 36×, 9×, and 4× stepped light guide system according to illustrative aspects of the invention;

FIGS. 8(A, B) are schematic views of a stepped light guide having one- and two-sided curved side edges, respectively, for increasing output light concentration, according to illustrative aspects of the invention;

FIGS. 10(A-C) illustrate a stepped light guide system in perspective, a top view of the stepped, tiled lenslet array, and a bottom view of the stepped light guide component, respectively; according to illustrative aspects of the invention; and FIGS. 11(A-C) show side cross sectional views of alternative stepped light guide system configurations, according to illustrative aspects of the invention.

DETAILED DESCRIPTION

Reference will now be made in detail to the present exemplary embodiments of the invention, examples of which are illustrated in the accompanying drawings. Wherever possible, the same reference numbers will be used throughout the drawings to refer to the same or like parts.

Concurrently filed application Ser. No. 12/490,417 entitled Light Collection and Concentration System, Components Thereof and Methods, discloses, among other things, a dimpled light guide component as well as a light collection and concentration system incorporating a dimpled light guide component. As discussed therein, various structural light bypass elements and light injection elements were incorporated into the component light guide to optimize light propagation within the guide that would otherwise be reduced due to light loss from the light injection elements themselves.

According to an embodiment of the invention described herein, a different structural layout of the component light guide is presented that also acts to optimize light propagation within the guide.

Figure 3:
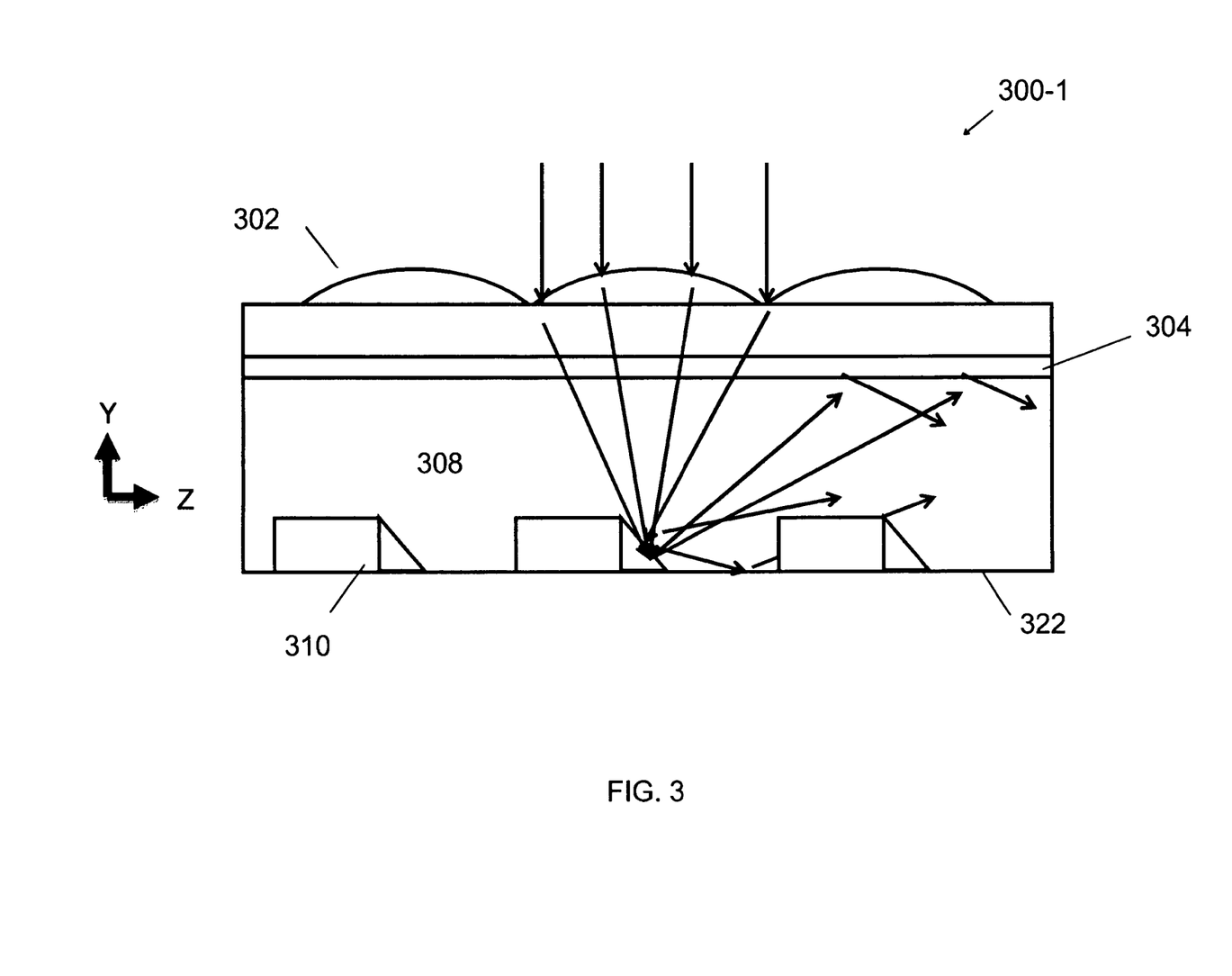
FIG. 3 schematically shows in cross section a one-sided light guide system according to an illustrative aspect of the invention.

FIG. 3 schematically shows in cross section a light guide system 300-1 according to an aspect of the invention, that illustrates elements in common with the light collection and concentration system according to an embodiment described in applicant's co-pending application, id. Those elements include the lenslet array 302, light guide (light transport) layer 308, low-index TIR layer 304 disposed immediately adjacent the top surface of the guide layer and the lenslet array, and light injection elements 310 in the form of air prisms as that term is used herein above and in the co-pending application. Another low index TIR layer (not shown) may be immediately adjacent the bottom surface 322 of the guide layer.

Figure 4:
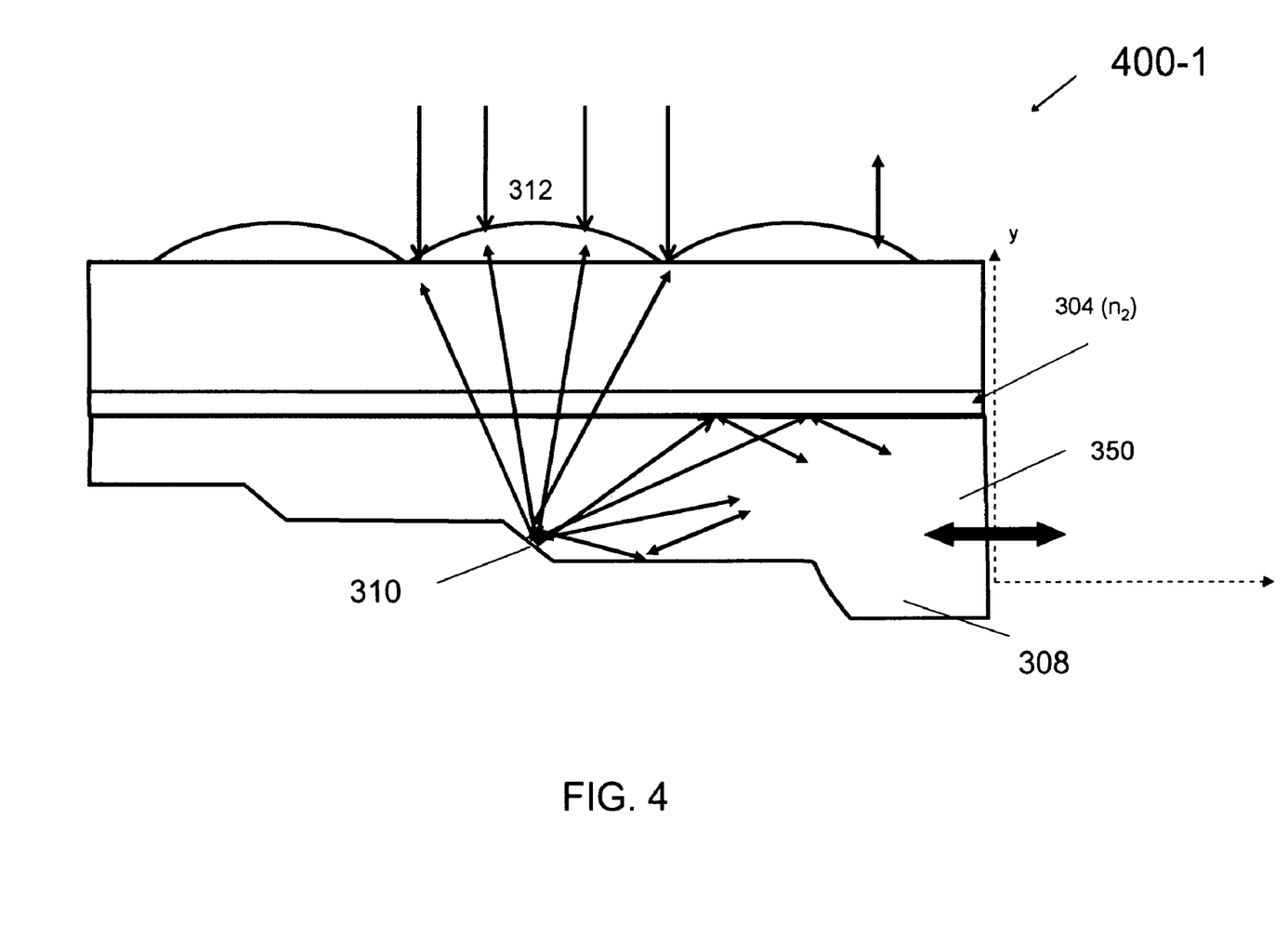
FIG. 4 is a side cross sectional view of a light guide collection/illumination system according to an aspect of the invention.

FIG. 4 shows a side cross sectional view of a portion of a light guide system 400-1 with coordinate axes. The double-headed arrows indicate that light can propagate in either direction depending on the application (e.g., collector or illuminator), as discussed herein. In terms of a light collection and concentration system embodiment for explanatory purposes, the injection elements 310 act to redirect incident light 312 from a direction (−y direction in FIG. 4) that is generally normal to the light guide to a (forward) propagation direction (z) in the light guide towards the exit window 350 of the guide layer 308.

Figure 5:
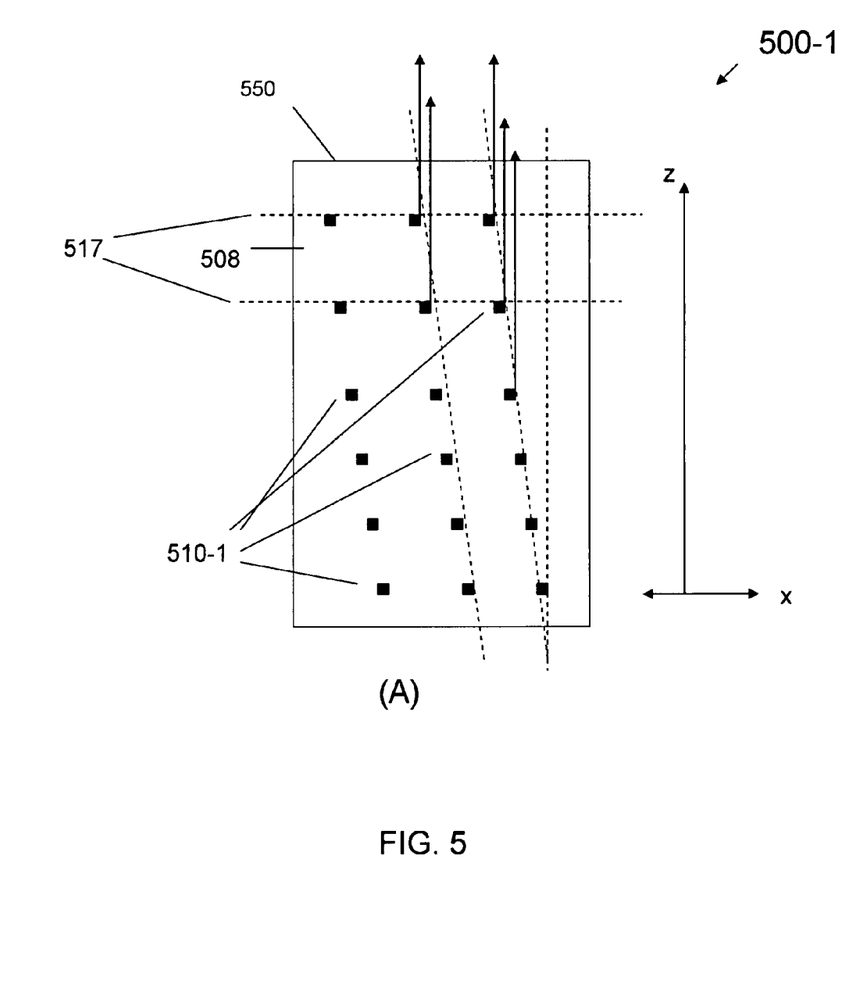
FIG. 5A is a schematic top plan view of a planar section of a stepped light guide according to an illustrative aspect of the invention.
FIG. 5B is a schematic top plan view of a planar section of a stepped light guide according to an alternative illustrative aspect of the invention.

FIG. 5A illustrates in a top plan view an exemplary component lateral stepped light guide 500-1. The guide 500-1 includes a guide layer 508 that further includes a first plurality of air prism type light injection elements 510-1 disposed in the bottom surface and extending inwardly therefrom at an angle to the surface. The light injection elements are stepped (staggered) in the z-direction in a first, respective z-x plane along lines (517) parallel to the side-end exit surface 550. FIG. 10(C) shows a similar view. FIG. 5B illustrates an alternative light guide component 500-2. In this aspect, the light injection elements 510-2 are aligned in straight rows along lines 518 normal to the exit face 550, however, the injection elements are clocked (tilted) about the y-axis to direct the light slightly off-axis so as to lessen interference with upstream injector elements.

Figure 6:
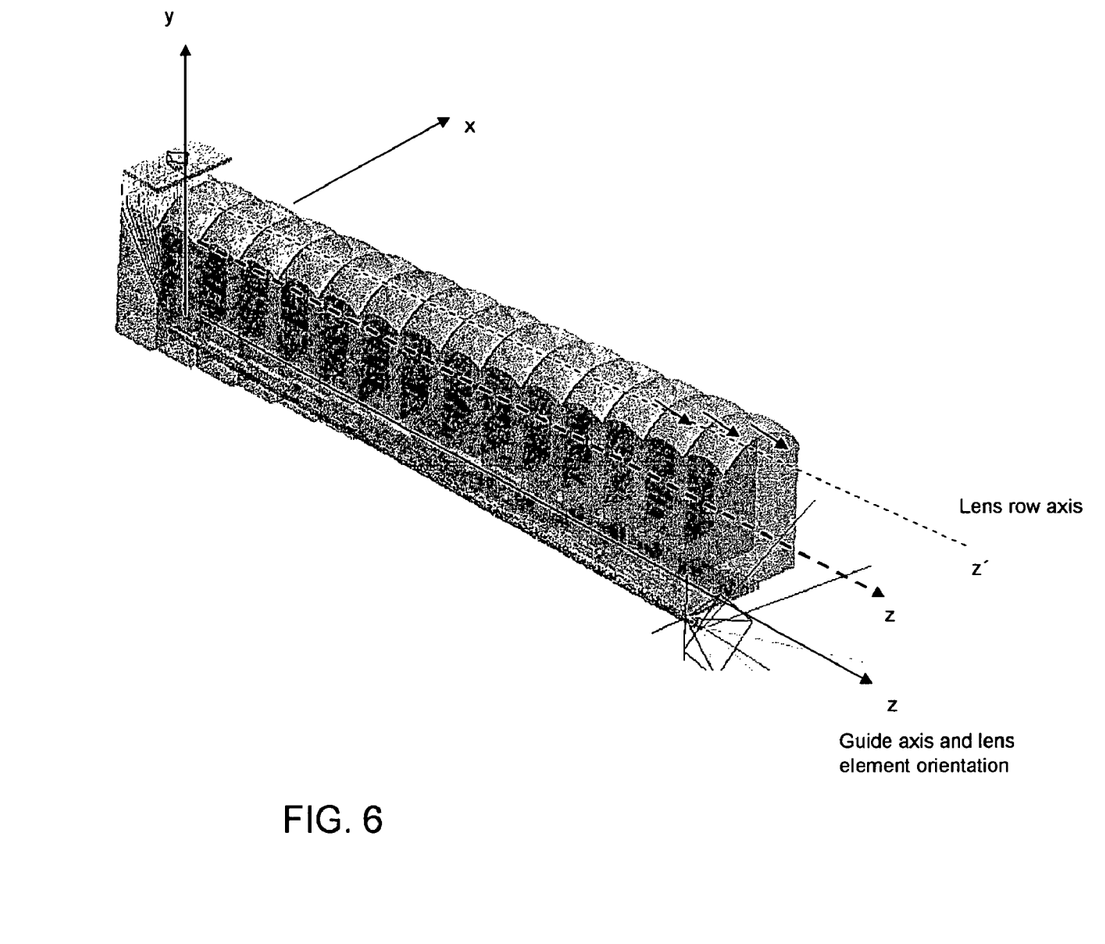
FIG. 6 is a schematic, perspective, constructional view of a single lenslet row light guide system that illustrates the horizontally-stepped nature of the system, according to illustrative aspects of the invention.

FIG. 6 provides a schematic, perspective view of a single lenslet row light guide system that illustrates the horizontally-stepped nature of the system, as illustrated in FIG. 5A.

The lateral stepped guide provides a means of collecting energy from multiple lenslets and redirecting that energy to a PV cell, for example. The smallest unit includes a strip of some number of lenslets, for example from 2 to 15 depending on the designed acceptance angle. Each lenslet focuses the input light and directs it to an injection facet that is located at or near this spot. As one moves from one lenslet to the next, each injection facet expands the lateral extend of the guide, creating a staircase-effect of injection facets. In this way, no downstream injection facets directly obstruct light already propagating in the guide. The 'primary concentration' metric of this design is the ratio of input aperture area to projected injection facet area perpendicular the guiding direction. The primary concentration and maximum number of achievable steps depends on the acceptance angle and numerical aperture of the lenslet. The upper limit of steps based on first order properties is given by:

$$StepNumber \leq \frac{\tan[\sin^{-1}(NA/n_{guide})]}{\tan[\sin^{-1}(n_{guide}^{-1}\sin\theta_b)]}$$

where, NA is the numerical aperture of the lenslet in the lateral dimension (x), and $\theta_b$ is the defined acceptance half-angle. $D_x$ and $D_z$ are the respective x- and z-pitches between adjacent lenslets, and f is the focal length of the lenslets. The first order concentration of a rectangular lenslet is given by:

$$C_{lenslet} = \frac{4D_xD_z}{\pi^2 f^2 \tan^2\theta_b}$$

To first order, for a given acceptance angle, the numerical aperture should be as large as possible. Spherical aberration, coma, astigmatism, and chromatic aberration limit the realistic minimum focal spot and maximum concentration. Also, if the injection facet supports TIR, the numerical aperture will be further limited to maintain the TIR condition for all incident angles. The input aperture of the lenslets may be rectangular or anamorphic in order to allow for a small numerical aperture in one dimension in order to maintain the TIR condition at the injection facet, but allow for a large numerical aperture in another dimension.

The size of the injection facet and its angle with respect to the guide determines the injected light guided concentration. The injection facet must be large enough to capture the focal spot for the acceptance angle of interest and must also be placed at an angle so that light is captured in the guiding layer. Additionally, for TIR injection facets, this angle must satisfy the TIR for all incident light. High concentration is achieved with shallow facet angles, but the constraints listed above calls for steeper facet angles. The two competing factors can be balanced during system optimization.

FIG. 7(A) schematically illustrates in perspective an exemplary, non-concentrating, component light guide 708 with three, stepped light injection facets 710 (e.g., 5 mm×2 mm) disposed in the x-z plane. Three respective, single plano-convex lens elements 702 (e.g., 30 mm×30 mm) receive incident radiation and concentrate the radiation onto the injection facets. As shown, the lenses are similarly laterally stepped as are the injection elements. The injection facets 710 could be mirrored surfaces or operate via TIR to inject the light into the light guide. FIG. 7(C) shows a top-down view of FIG. 7(A), wherein the larger squares 702' each represent the area of a lens aperture, $A_{lens}$, while the smaller squares 710' each represent the area of an injection facet, $A_{IF}$. In this exemplary aspect, $A_{lens}/A_{IF}=9$, providing a 9× field concentration. FIGS. 7(B) and 7(D), respectively, show exemplary 36× and 4× field concentrations, corresponding to a ±1.5° and ±14° acceptance angle at the lens apertures.

Figure 8:
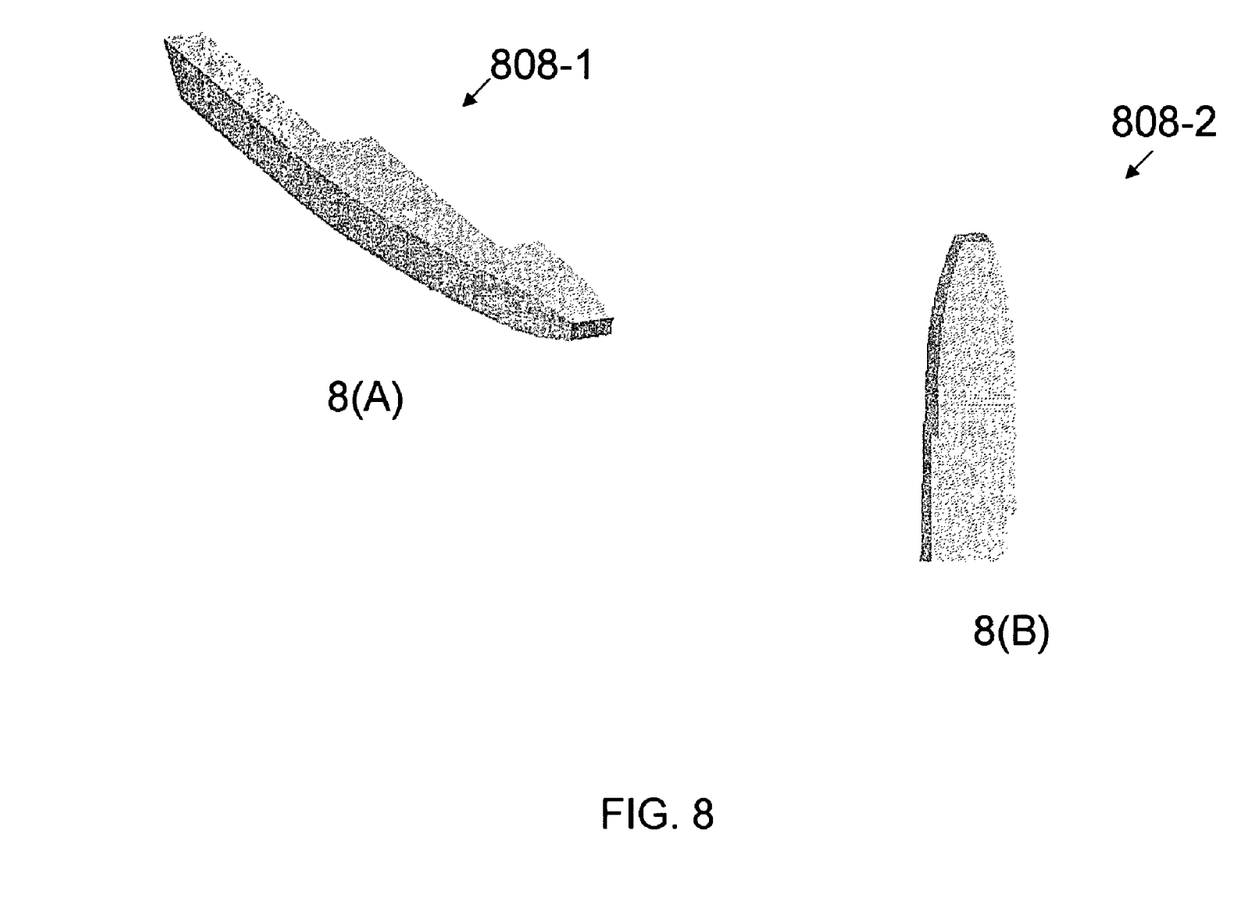

Once light is propagating in the guide, additional secondary concentration can be obtained in two ways. In one aspect, one lateral edge of the guide is curved as shown by guide 808-1 in FIG. 8(A). Here, the total lateral dimension of the guiding layer is "squeezed," providing addition concentration. The maximum amount of additional concentration is related to the lateral numerical aperture of the lenslets. A lenslet's lateral numerical aperture and potential lateral secondary concentration are inversely proportional. The exact shape of the curve along the guide will depend on the number of lenslets and their numerical aperture. The maximum lateral secondary concentration is given by:

$$C_{lateral} \leq \frac{n_{guide}}{\sin[U_a + \theta_b]}, \quad U_a = \sin^{-1}\frac{NA_{lateral}}{n_{guide}}$$

Alternatively, secondary concentration can be applied just before the exit aperture and PV cell, perpendicular to the guide, as illustrated in FIG. 8(B). The shape of this concentration is similar to a classic angle-angle concentrator, and the maximum attainable concentration will depend on the maximum ray angles in the y-z plane. This maximum angle is related to the primary lenslet numerical aperture and injection facet angle.

First-order y-z angle in guide:

$$\chi = \sin^{-1}\frac{NA_{YZ}}{n_{guide}} + \theta_b + \left|2\alpha_{injection} - \frac{\pi}{2}\right|$$

Maximum y-z secondary concentration:

$$C_{YZ} \leq \frac{n_{guide}}{\sin\chi}$$

Figure 7:
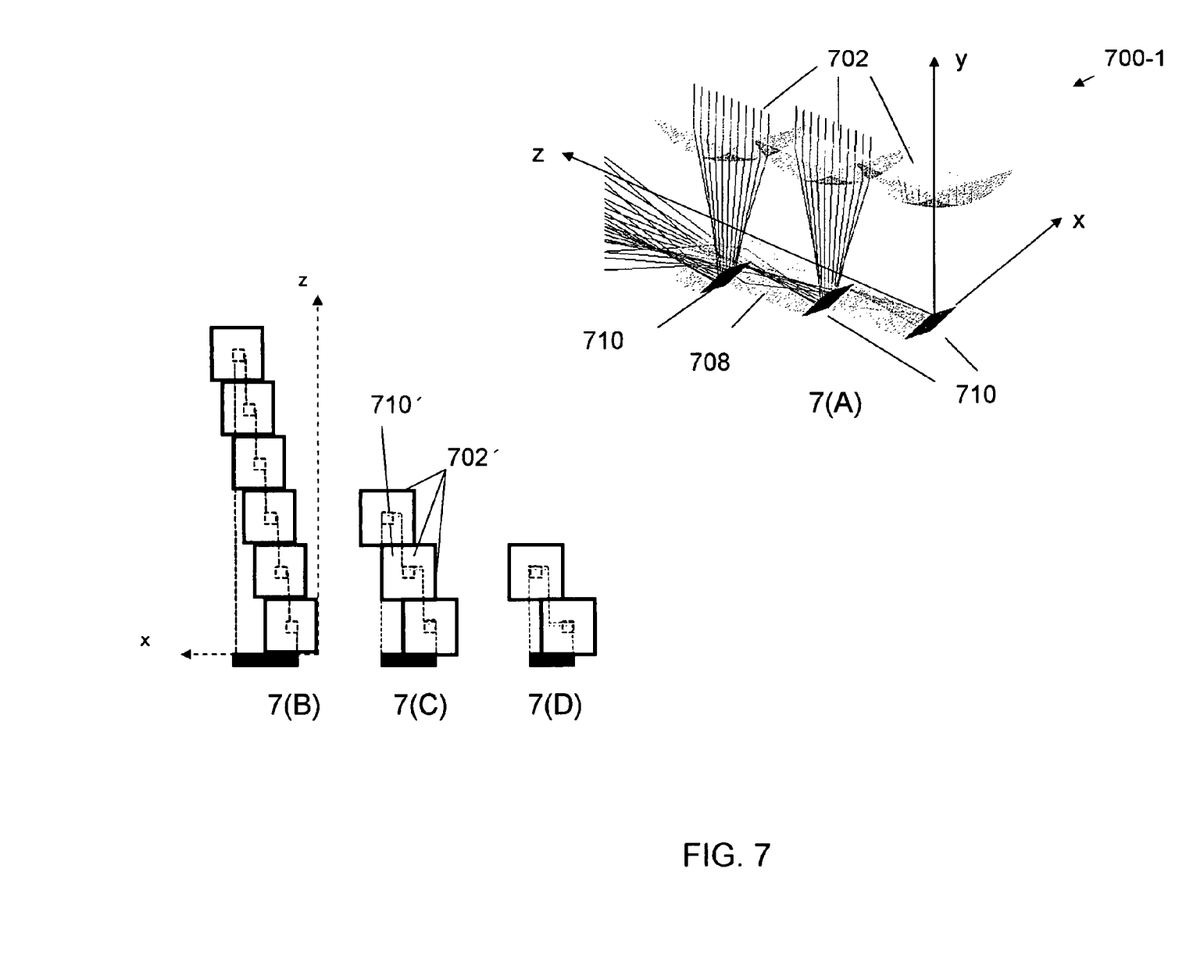
Figure 9:
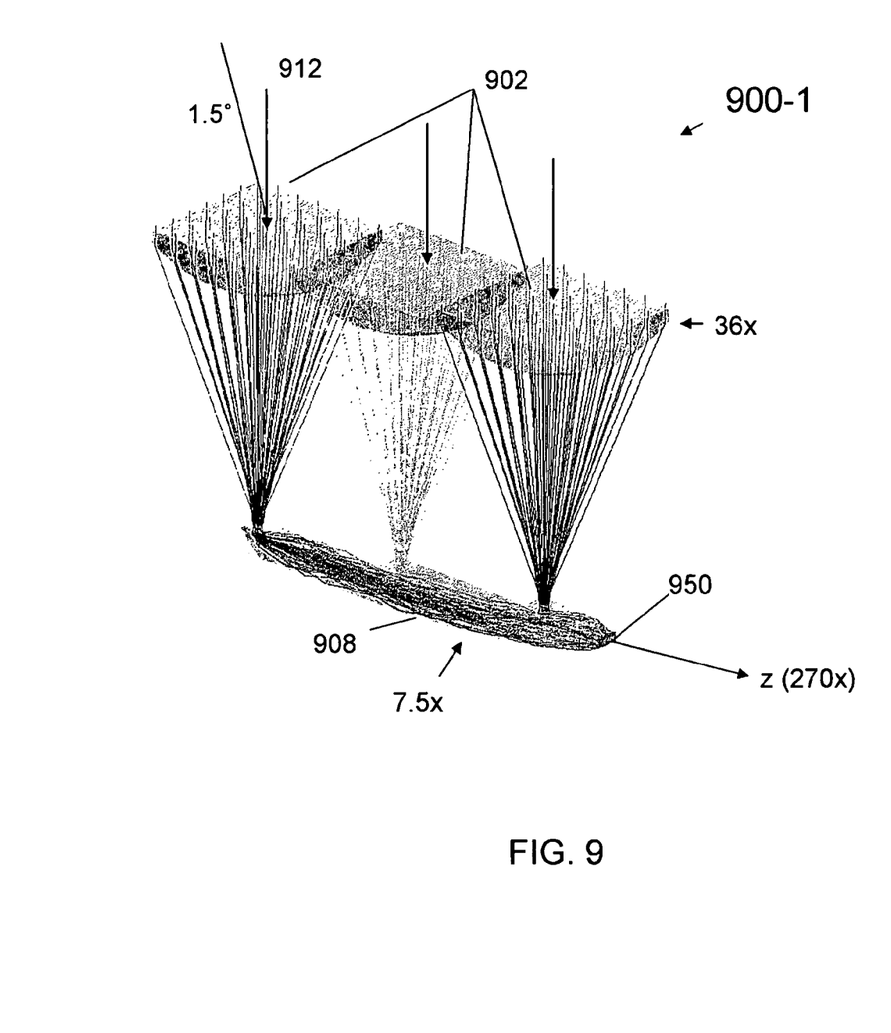
FIG. 9 is a perspective, schematic view of a high concentration, stepped light guide system providing a 270× light concentration, according to an illustrative aspect of the invention.

FIG. 9 illustrates a relatively higher concentration light guide system 900-1 than 700-1 shown in FIG. 7. The exemplary system 900-1 shows three 30 mm×30 mm lenslets 902 as the primary concentrator component. For respective injection facet dimensions of 5 mm×2 mm, the primary concentration is 36× as illustrated in FIG. 7(B). The light guide 908 combines guide shapes as shown in FIGS. 8A and 8B, which respectively provide 3× and 2.5× concentration for a total 270× concentration at a ±1.5° acceptance angle.

Figure 10:
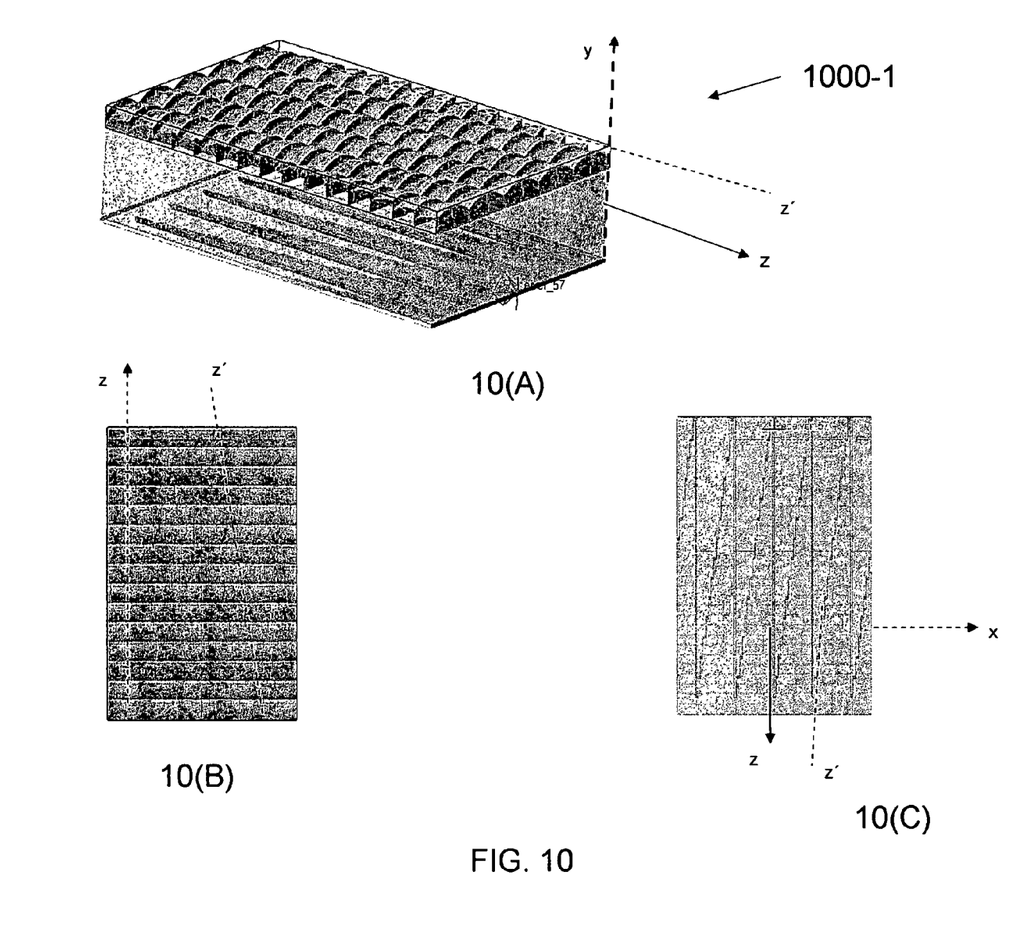

FIGS. 10(A-C), respectively, illustrate a stepped light guide system 1000-1, a top view of the stepped, tiled lenslet array, and a bottom view of the stepped light guide component. As shown in FIGS. 10A, B, the lenslets are laterally stepped in conjunction with the injection elements along lines z' with respect to light propagation direction z. Thus depending upon the various performance and component parameters discussed hereinabove, the maximum number of lenslets, and injection elements in a single x-z plane, can be determined.

A stepped guide minimizes losses in the guide layer by positioning injection facets in a manner that they will not obstruct or divert any light already traveling down the guide. In order to efficiently use the volume of the guide layer, injection facets can be horizontally stepped in two or more vertically displaced and/or tilted planes. Injection facets are first stepped in the plane parallel with the light guide (horizontal step) as discussed above. Once the limit is reached for horizontal stepping, a step that is vertically displaced with respect to the guide layer can be introduced. The horizontal stepping is then repeated in this plane before another vertical step is made. This vertical integration allows the system to keep a maintain a thin profile without the injection facets obstructing any of the light.

Figure 11:
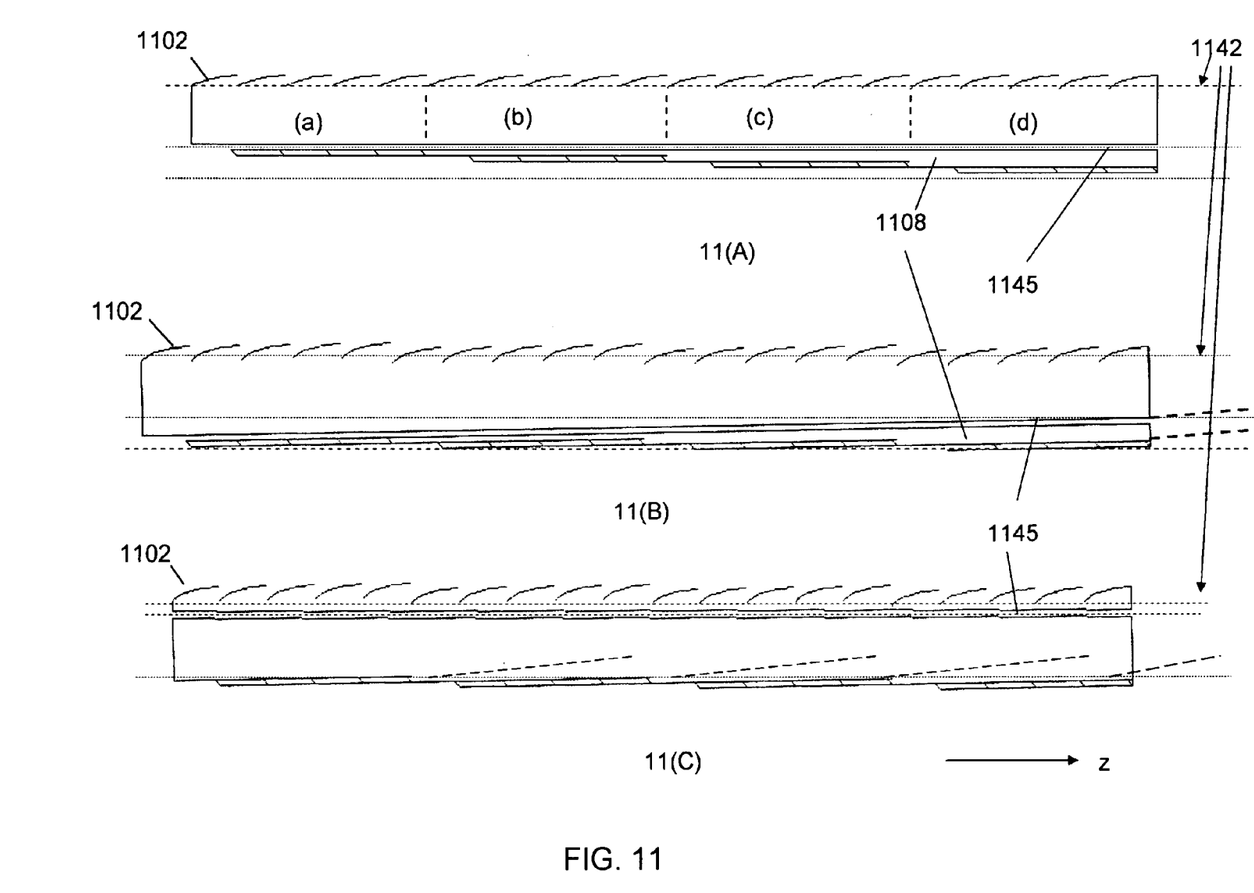

According to aspects of the invention, vertical steps that do not alter the functional design of individual elements may be implemented as shown in FIGS. 11(A-C) as follows:

For each of FIGS. 11(A-C), the lenslet plane is shown by dotted line 1142. A TIR medium layer 1145 separates the guide layer 1108 from the primary lens component 1102. In FIG. 11A, the stepped light guide system is realized by scaling (by, e.g., a scaling factor) both the lenslets and steps in each consecutive vertical section (a, b, c, d, . . . ) of similar size, shown separated by vertical dotted lines. In this aspect, neither the TIR medium layer nor the stepped light guide sections are tilted with respect to the lenslet plane. Horizontally stepped guide layers are vertically displaced. The design is advantageously scaled so that the guide layers of consecutive steps line up top to bottom while the lens array remains on the same plane. Vertical steps can be made until it no longer becomes practical due to manufacturing constraints or material absorption.

As shown in FIG. 11B, the TIR medium layer and the stepped light guide sections are tilted with respect to the lenslet plane; and, the horizontally stepped guide layers are vertically displaced. However, with each consecutive step the overall system remains flat. Again, the guide layer's consecutive steps will be aligned top to bottom. The TIR medium layer will be parallel to the bottom surface of the guide layer. It is convenient for manufacturing that all the features are the same scale. In this variation, the number of vertical steps will be limited by the total guide layer thickness divided by the step height.

In FIG. 11C, the TIR medium layer is not tilted with respect to the lenslet plane; the horizontally stepped guide layers are tilted with respect to the lenslet plane; and, the horizontally stepped guide layers are not vertically displaced. Thus the guide layer flat relative to the entire system. This is convenient for manufacturing purposes and lessens the constraint on total length, since this version is feasible only when the angle of the tilted steps is very small. As light propagates down the guide layer it will increase in angular spread as it bounces off of the non parallel surfaces and eventually leaks out if the guide is too long.

For verification, the stepped light guide designs were modeled in LightTools®. They were optimized with the AM1.5 g solar spectrum for a +/−1.25 degree field. The optical material used was BK7 and the models included absorption data, which had little impact on performance (but absorption in plastic will likely have a noticeable effect on transmission and overall lifetime). The low index layer was modeled similar to optical Teflon at n=1.38. The table below shows the layout for a tilted and a scaled stepped light guide system. These dimensions can be scaled for manufacturing purposes without affecting optical performance (absorption aside).

Optical material BK7, n=1.5;

TIR medium layer, n=1.38;

AM1.5 g Spectrum 350-1110 nn;

acceptance angle: ±1.25 deg;

All dimensions in cm.

| Tilted Step System | | |
|---|---|---|
| Lens Aperture | Horizontal Steps | Chip size |
| 3 | 16 | 4 |
| 1.6 | Vertical Steps | Geometric Conc. |
| Facet aperture | 20 | 112.5 |
| 0.2 | System Length | |
| 0.2 | 450 | |

-continued

| Tilted Step System | |
| --- | --- |
| Thickness | Step Tilt |
| 5 | 0.51 degrees | dimensions in mm

| Scaled Step System | | |
| --- | --- | --- |
| Lens Aperture thick end (small end) | Horizontal Steps | Chip size |
| 5 (1.5) | 16 | 2.5 |
| 1.5 (.75) | Vertical Steps | Geometric Conc. |
| Facet aperture | 16 | 112.5 |
| 0.2 (.1) | System Length | |
| 0.2 (.1) | 272.6 | |
| Thickness | Step Scale | |
| 5 (2.5) | 5/5.2 | | dimensions in mm

Primary losses are from Fresnel reflection when light enters the system, ~5%. Ignoring absorption, nominal system efficiency is 94% and >90% for ±1 degree. Adding cover glass, or using a system with an air gap instead of a low index layer, will result in an additional 8-10% optical loss without anti-reflection coatings. When absorption data is introduced into the model it will cause losses to increase with system length.

A secondary concentrator can be added at the end of these systems, increasing the concentration. Greater secondary concentration will require more material and make the system longer. Modeling indicated that a 200× concentration will require concentration only in the flat dimension and approximately one centimeter of material. Higher concentrations will require longer secondary concentrators that work in both dimensions.

Although the component light guide and light guide system has been described above as a forward propagation system applicable to light collection and concentration for, e.g., a CPV solar system, it will be appreciated that optically the system could function in reverse. In this aspect, a concentrated source of light could be input to the guide layer at the side-end exit/entrance aperture, propagate in the (−)z direction to the injection elements and reflect up and out of the guide layer to a lenslet array (or other optical condenser system) to provide illumination over an extended field.

The use of the terms "a" and "an" and "the" and similar references in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening.

The recitation of ranges of values herein are merely intended to serve as a shorthand method of referring individually to each separate value falling within the range, unless otherwise indicated herein, and each separate value is incorporated into the specification as if it were individually recited herein.

All methods described herein can be performed in any suitable order unless otherwise indicated herein or otherwise clearly contradicted by context. The use of any and all examples, or exemplary language (e.g., "such as") provided herein, is intended merely to better illuminate embodiments of the invention and does not impose a limitation on the scope of the invention unless otherwise claimed. No language in the specification should be construed as indicating any non-claimed element as essential to the practice of the invention.

It will be apparent to those skilled in the art that various modifications and variations can be made to the present invention without departing from the spirit and scope of the invention. There is no intention to limit the invention to the specific form or forms disclosed, but on the contrary, the intention is to cover all modifications, alternative constructions, and equivalents falling within the spirit and scope of the invention, as defined in the appended claims. Thus, it is intended that the present invention cover the modifications and variations of this invention provided they come within the scope of the appended claims and their equivalents.

We claim:

1. A light guide system, comprising:
   a light guide having a top surface and a bottom surface, characterized by an index of refraction, $n_1$, and a transversely oriented side-end surface that forms a primary aperture for light traveling into and out of the light guide, further characterized by a length dimension in an intended light propagation direction towards or away from the primary aperture;
   a first plurality of light injection elements disposed in at least one of the top and bottom surfaces and extending inwardly therefrom at an angle to the surface, wherein the light injection elements are stepped (staggered) in a z-axis-light propagation direction in a respective first plane along lines parallel to the side-end surface;
   a lenslet array having a defined lenslet plane, disposed adjacent a top surface of the light guide, wherein each lenslet is in optical registration with a respective light injection element; and
   a light-transmitting medium layer characterized by an index of refraction, $n_{med}$, where $n_{med}$ is less than $n_1$, disposed between the lenslet array and the top surface of the light guide.

2. The light guide system of claim 1, further comprising at least a second plurality of light injection elements disposed in the same at least one of the top and bottom surfaces as the first plurality of light injection elements and extending inwardly therefrom at an angle to the surface, wherein the at least second plurality of the light injection elements are stepped in the z-axis-light propagation direction in a respective at least second plane along lines parallel to the side-end surface.

3. The light guide system of claim 2, wherein the medium layer is not tilted with respect to the lenslet plane, further wherein the light guide is not tilted with respect to the lenslet plane, and further wherein the at least second plane is vertically displaced from the first plane.

4. The light guide system of claim 2, wherein the medium layer is tilted with respect to the lenslet plane, further wherein the light guide is tilted with respect to the lenslet plane parallel to the medium layer, and further wherein the at least second plane is vertically displaced from the first plane.

5. The light guide system of claim 2, wherein the medium layer is not tilted with respect to the lenslet plane, further wherein the light guide is not tilted with respect to the lenslet plane, and further wherein the first plane and the at least second plane are parallelly tilted with respect to the lenslet plane and not vertically displaced from one another.

6. The light guide system of claim 1, wherein the light injection elements are air prisms.

7. The light guide system of claim 1, wherein the light-transmitting medium layer is air.

8. The light guide system of claim 1, wherein the light-transmitting medium layer is solid.

9. The light guide system of claim 1, further comprising a TIR layer disposed immediately adjacent the bottom surface of the light guide.

10. The light guide system of claim 9, wherein the plurality of light injection elements are disposed in the bottom surface of the light guide.

11. The light guide system of claim 1, wherein the lenslet array is a refractive lenslet array.

12. The light guide system of claim 11, wherein each of the lenslets have curvature in two dimensions.

13. The light guide system of claim 12, wherein the curvatures are equal.

14. The light guide system of claim 1, wherein the lenslet array is an array of Fresnel lenses.

15. The light guide system of claim 1, wherein the lenslet array has optical characteristics that provide converging light on the injection elements from a substantially plane wave input light.

16. A light guide system, comprising:
a light guide having a top surface and a bottom surface, characterized by an index of refraction, $n_1$, and a transversely oriented side-end surface that forms a primary aperture for light traveling into and out of the light guide, further characterized by a length dimension in an intended light propagation direction towards or away from the primary aperture;
a first plurality of light injection elements disposed in at least one of the top and bottom surfaces and extending inwardly therefrom at an angle to the surface, wherein the light injection elements are clocked (tilted) about a y-axis in a z-axis-light propagation direction in a respective first plane, wherein the light injection elements are disposed along parallel lines normal to the side-end surface;
a lenslet array having a defined lenslet plane, disposed adjacent a top surface of the light guide, wherein each lenslet is in optical registration with a respective light injection element; and
a light-transmitting medium layer characterized by an index of refraction, $n_{med}$, where $n_{med}$ is less than $n_1$, disposed between the lenslet array and the top surface of the light guide.

17. A light guide apparatus, comprising:
a light guide having a top surface and a bottom surface, characterized by an index of refraction, $n_1$, and a transversely oriented side-end surface that forms a primary aperture for light traveling into and out of the light guide, further characterized by a length dimension in an intended light propagation direction towards or away from the primary aperture; and
a first plurality of light injection elements disposed in at least one of the top and bottom surfaces and extending inwardly therefrom at an angle to the surface, wherein the light injection elements are stepped (staggered) in a z-axis-light propagation direction in a respective first plane along lines parallel to the side-end surface.

18. The light guide apparatus of claim 17, further comprising at least a second plurality of light injection elements disposed in the same at least one of the top and bottom surfaces as the first plurality of light injection elements and extending inwardly therefrom at an angle to the surface, wherein the at least second plurality of the light injection elements are stepped in the z-axis-light propagation direction in a respective at least second plane along lines parallel to the side-end surface.

19. The light guide apparatus of claim 18, wherein the light guide is not tilted with respect to a horizontal plane, further wherein the at least second plane is vertically displaced from the first plane.

20. The light guide apparatus of claim 18, wherein the light guide is tilted with respect to a horizontal plane, further wherein the at least second plane is vertically displaced from the first plane.

21. The light guide apparatus of claim 18, wherein the light guide is not tilted with respect to a horizontal plane, further wherein the first plane and the at least second plane are parallelly tilted with respect to the horizontal plane and not vertically displaced from one another.

22. The light guide apparatus of claim 17, wherein the light injection elements are air prisms.

23. The light guide apparatus of claim 17, further comprising a TIR layer disposed immediately adjacent the top surface of the light guide.

24. The light guide apparatus of claim 23, wherein the plurality of light injection elements are disposed in the bottom surface of the light guide.

25. A light guide apparatus, comprising:
a light guide having a top surface and a bottom surface, characterized by an index of refraction, $n_1$, and a transversely oriented side-end surface that forms a primary aperture for light traveling into and out of the light guide, further characterized by a length dimension in an intended light propagation direction towards or away from the primary aperture; and
a first plurality of light injection elements disposed in at least one of the top and bottom surfaces and extending inwardly therefrom at an angle to the surface, wherein the light injection elements are clocked (tilted) about a y-axis in a z-axis-light propagation direction in a respective first plane, wherein the light injection elements are disposed along parallel lines normal to the side-end surface.

* * * * *